United States Patent [19]

Rhemer et al.

[11] Patent Number: 4,475,980

[45] Date of Patent: Oct. 9, 1984

[54] SOLID STATE PRODUCTION OF MULTIPLE SINGLE CRYSTAL ARTICLES

[75] Inventors: Chris C. Rhemer; Scott E. Hughes; William J. Gostic, all of Jupiter, Fla.

[73] Assignee: United Technologies Corporation, Hartford, Conn.

[21] Appl. No.: 383,872

[22] Filed: Jun. 1, 1982

[51] Int. Cl.³ .............................................. C30B 1/08
[52] U.S. Cl. ................................. 156/603; 156/616 R; 156/DIG. 65; 156/DIG. 73; 156/DIG. 88; 156/DIG. 100; 148/11.5 N
[58] Field of Search ........... 156/603, 616 R, DIG. 65, 156/DIG. 73, DIG. 88, DIG. 100, 612; 148/2, 3, 11.5 N, 11.5 P; 420/441, 446

[56] References Cited

U.S. PATENT DOCUMENTS

| | | | |
|---|---|---|---|
| 3,027,281 | 3/1962 | Osborn et al. ....................... | 156/603 |
| 3,108,861 | 10/1963 | Cape ..................................... | 420/441 |
| 3,494,709 | 2/1970 | Piearcey ............................... | 420/446 |
| 3,956,032 | 5/1976 | Powell et al. ....................... | 156/612 |
| 3,975,219 | 8/1976 | Allen et al. ........................ | 148/11.5 P |
| 4,044,618 | 9/1977 | Chaudhari et al. ................. | 156/603 |
| 4,196,041 | 4/1980 | Baghdadi et al. ........... | 156/DIG. 65 |
| 4,209,348 | 6/1980 | Duhl et al. .............................. | 148/3 |
| 4,318,753 | 3/1982 | Anderson, Jr. et al. ................ | 148/3 |
| 4,385,939 | 5/1983 | Kortovich, Jr. et al. .............. | 148/3 |

FOREIGN PATENT DOCUMENTS 2079175  1/1982  United Kingdom ................ 156/603

Primary Examiner—David L. Lacey
Attorney, Agent, or Firm—Charles E. Sohl

[57] ABSTRACT

A process is described for the production of multiple single crystal articles having identical crystallographic orientations. A starting article is provided which consists of a single crystal portion and a fine grain portion. This starting article is bonded to another fine grain portion and the single crystal is caused to grow into the second article. The growth of the crystal is then stopped and the bonded article is severed to provide a single crystal article and another portion which can be used to repeat the process.

6 Claims, 11 Drawing Figures

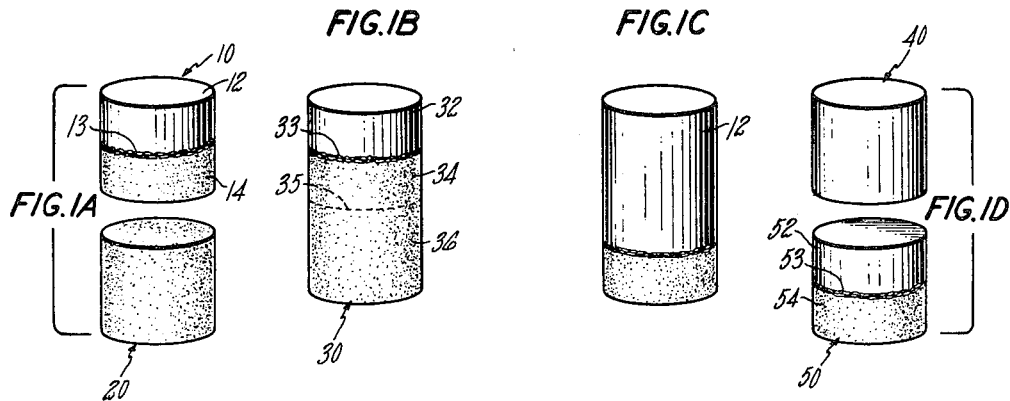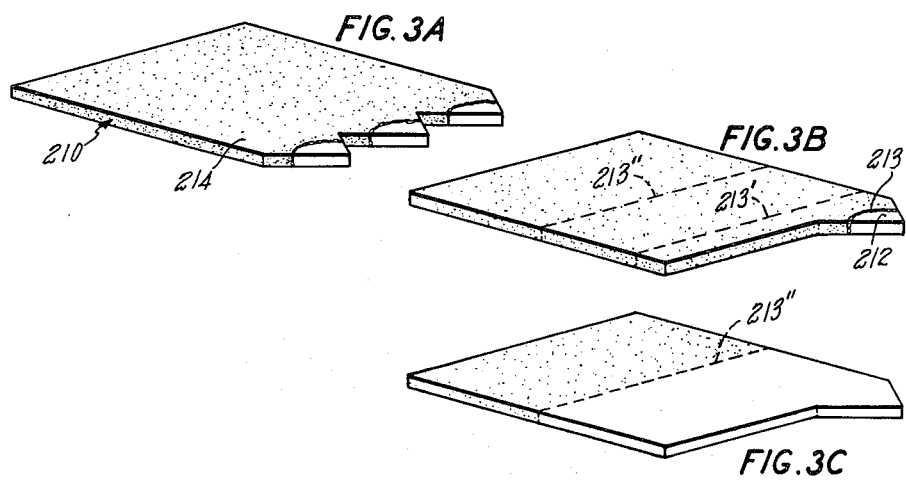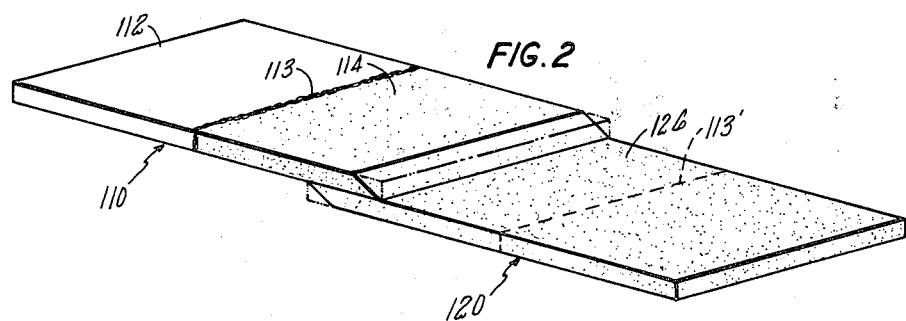

LEADING EDGE →

|—40μ—|  ↑ DIFFUSION BOND JOINT  500X

SOLID STATE PRODUCTION OF MULTIPLE SINGLE CRYSTAL ARTICLES

DESCRIPTION

1. Technical Field

This invention relates to the field of solid state production of single crystal articles and provides a method for the repetitive production of identically oriented single crystal superalloy articles.

2. Background Art

Metallic single crystals have been known in the art for many years. Until the 1960's, they were viewed as a laboratory curiosity, or at best a tool for investigating the fundamentals of the behavior of metals. In the early 1960's, it became appreciated that for certain high temperature applications metallic single crystals offered the promise of superior mechanical properties. Well before this time, a variety of solid state laboratory techniques had been developed to produce metallic single crystals. These techniques involve recrystallization and/or grain growth, and are described in the book *The Art and Science of Growing Crystals* by J. J. Gilman, Wiley Publishing Company, 1963.

However, it is not known that there was ever a need or a technique to produce large quantities of identical single crystal superalloy material with controlled crystal orientation. When such a need recently arose in connection with the production of single crystal turbine blades for aircraft engines, initial attempts were made to use a single crystal as a seed by bonding the single crystal to another (fine grain) article in which propagation of that crystal was desired. This technique proved to be unsatisfactory except in a few limited cases, and the reasons for the limited success are not understood. It appears that the nature of the boundary or interface between the single crystal and the fine grained portion is crucial to the mobility of the boundary and that bonding a single crystal seed onto another element does not (usually) produce a mobile boundary. It was thus apparent that a need existed for a method for reproducing a single crystal so that substantial quantities of identically oriented single crystal material could be obtained.

DISCLOSURE OF INVENTION

Identical single crystal articles are produced by a solid state technique which simultaneously produces both a single crystal article and another article which can be used as a seed to repeat the process. The process starts with a seed article having a single crystal portion and a fine grain portion. The fine grain portion of this article is bonded to another article comprised entirely of fine grain material. Growth of the single crystal is caused by passage through a thermal gradient, and the single crystal grows consuming the fine grain material and the bond joint. Single crystal growth is stopped prior to complete conversion of the bonded article of a single crystal. The bonded article is then severed to provide a portion which is completely a single crystal and another portion which is partially a single crystal and partially fine grain material. The latter portion can be used to repeat the process. The process can be repetitively used to produce multiple single crystal articles of identical orientation.

The foregoing, and other features and advantages of the present invention, will become more apparent from the following description and accompanying drawing.

BRIEF DESCRIPTION OF THE DRAWINGS

FIGS. 1A, 1B, 1C and 1D illustrate successive stages in the production of single crystal material according to the present invention;

FIG. 2 illustrates the application of the invention to sheet stock material;

FIGS. 3A, 3B and 3C illustrate successive stages in the initial production of single crystal material for use with the present invention;

BEST MODE FOR CARRYING OUT THE INVENTION

Figure 4:
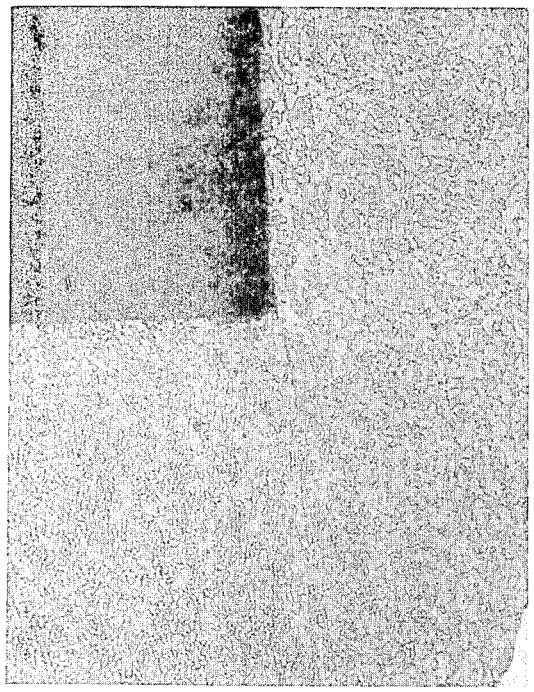
FIG. 4 is a photomicrograph of a satisfactory bond for the practice of the invention.

The process of the invention is generally applicable to a wide range of nickel base superalloys, those alloys based on nickel which are strengthened by the gamma prime phase ($Ni_3 Al Ti$). A representative broad composition range is 2–9% Al, 0–6% Ti, 0–16% Mo, 0–12% Ta, 0–12% W, 0–4% Cb, 0–20% Cr, 0–20% Co, 0–0.3% C, 0–1% Y, 0–0.3% B, 0–0.3% Zr, 0–2% V, 0–5% Re, 0–3% Hf, balance essentially nickel.

The starting superalloy material must be provided in workable form. One approach is to use consolidated powder, another approach is to start with a casting, preferably fine grained. The following is a description of a preferred technique to prepare starting material for the practice of the invention. This material is hot worked at a temperature near but below the gamma prime solvus. This initial hot working is preferably in an amount in excess of about 50% to ensure adequate workability. This hot worked material is then cold rolled about 65%. The cold rolling step is performed as follows: the material is first cold rolled. A second cold rolling step is performed in the cross rolling direction, i.e. a direction 90° removed from the direction of inital cold rolling. The ratio of the reductions in the initial cold rolling step and final cold cross rolling step is about 75:25. Intermediate annealing steps are employed during both cold and hot rolling steps as necessary to prevent cracking. The result is an article having a strong {110}<112> sheet texture.

This textured material can then be directionally recrystallized to produce single crystals of a controlled orientation. The {110}<112> texture strongly influences the orientation of the recrystallized grains. By varying the directional recrystallization parameters, a selection of the available orientation combinations can be made. The technique described above is described more fully in U.S. patent application Ser. No. 325,248 filed on Nov. 27, 1981, which is incorporated herein by reference.

One of the essential features required for successive directional grain growth is the establishment of conditions which favor grain growth of existing grains rather than the nucleation of new grains. Microstructures and processes which favor these conditions are described in U.S. Pat. No. 3,975,219 and pending U.S. patent application Ser. Nos. 84,263, filed Oct. 12, 1979 and 325,248, filed Nov. 27, 1981, which are incorporated herein by reference. Through these teachings, it is possible to establish the desired conditions in a superalloy article. However, for the present invention to be successful, it is necessary that two such articles be bonded together and the nature of the bond be such that grain growth can readily occur through the bond without nucleation of new grains at the bond interface. Thus, the character of the bond is critical to the success of the invention. The optimum bond will be one which is undetectable, at least under visual examination at about 100×; one which presents no gross changes in composition or microstructure from the base material to the bond area. Such a bond is best achieved through diffusion bonding. In this process, the two articles to be joined are cleaned and the faces to be bonded are placed in juxtaposition and heated to a temperature near but below the gamma prime solvus while pressure is applied. Under proper conditions of temperature, pressure and time, diffusion occurs from one article to the other across the interface and bonding results. In order to produce such diffusion effects, the flatness and surface finish of the articles must be high so that maximum surface contact is obtained, and the surfaces to be bonded must be exceptionally clean. Surface finish requirements include surface roughness of less than 15 micro inches RMS (381 microns RMS), and a surface flatness of less than 0.0002 inch (0.0005 cm). The required surface finish characteristics can be obtained through double disk grinding or surface grinding or lapping, or combinations of these processes. In practice, we have used electropolishing as a final surface preparation technique to produce a clean surface free from cold work. We prefer to remove at least about 0.0001 inch (0.0003 cm) per surface by electropolishing. The diffusion bonding process itself is best performed in vacuum although possibly an inert atmosphere might be employed. When vacuum is employed, vacuum levels on the order of less than $10^{-4}$ torr are necessary. The temperature at which the bonding process is performed for superalloys ranges from about 1900° F. to about 2200° F. (1038° C. to about 1204° C.), and is preferably in the range of 150° F.–400° F. (66° C.–204° C.) below the gamma prime solvus. The pressure requirement is that amount of pressure necessary to produce from 1% to 8% total deformation during the bonding process, with deformations of about 2% being preferred. Such pressures can be developed using vacuum hot press tooling, tooling which uses resistance heating of the material being joined and so called delta-apha tooling in which tooling, typically of molybdenum which has a lower coefficient of thermal expansion of superalloys is employed to restrain the alloys and the pressure is developed by the relative expansion of the superalloy constrained by the tooling. Diffusion bonding times will range from about one minute to about three hours, depending on the method used to develop the bonding pressure and the temperature of bonding.

The invention may be better understood through reference to the accompanying Figures. FIGS. 1A, 1B, 1C and 1D illustrate four steps in the process of the invention. FIG. 1A shows two elements 10 and 20. Element 10 is a seed portion comprised of a single crystal 12 and a fine grain material 14 which are separated by a boundary 13. Element 20 is comprised entirely of a fine grain material similar to and usually identical to that found in 14 of element 10.

FIG. 1B illustrates a subsequent stage in the process of the invention. In FIG. 1B, the original elements 10 and 20 have been diffusion bonded together to form article 30. Portion 32 is a single crystal portion, 33 is the boundary, 34 and 36 are fine grain portions, and 35 is the diffusion bond joint between the original elements 10 and 20.

FIG. 1C shows the configuration of the article after the directional grain growth procedure has been used to grow the single crystal, thereby moving the boundary between the single crystal and the fine grain portion down the article, through the joint 35 between original elements 10 and 20, and consuming a substantial amount of fine grain material converting it to single crystal material of exactly the same orientation as that of the seed single crystal 12.

FIG. 1D shows the article after it has been cut into two components. Component 40 is the single crystal product of the process while component 50 consists of a single crystal portion 52 and fine grain portion 54 separated by boundary portion 53 and is identical to initial starting portion 10 shown in FIG. 1A. Thus, it can be clearly seen that the invention process may be repeated numerous times with the input articles being fine grained material which is receptive to grain growth and the output being single crystal articles whose crystallographic orientation is carefully controlled. The control over crystal orientation in the product of the invention process appears to be limited only by the mechanical accuracy of the tooling employed.

FIGS. 1A, 1B, 1C and 1D illustrate the invention as it might be applied to a rod-shaped article. However, some articles for which the single crystal material produced by the invention has particular utility require the production of single crystal material in the form of sheets or plates whose thicknesses are on the order of 0.010 to 0.200 inches (0.025 to 0.508 cm). The production of these materials is illustrated in FIG. 2 which is analogous to FIG. 1B and which shows a bonded sheet stock article comprised of an element 110 bonded to element 120. Element 110 contains single crystal portion 112 and a fine grain portion 114 separated by boundary 113. Element 120 is comprised entirely of fine grain material which is amenable to directional grain growth. Subsequently, the material is passed through a thermal gradient, in a manner which will be described below, to cause the single crystal portion 112 to grow down the length of the bonded article in the direction of the element 120. A unique and essential aspect of this embodiment of the invention is that the single crystal grows "sideways" through the lap joint and then proceeds down the element 120. The boundary at this point may be, for example, at the position shown as 113'. At this point, the condition of the article would be analogous to that of FIG. 1C in that the single crystal portion would comprise the major portion of the bonded article. The article can be severed as was shown in FIG. 1D providing a single crystal component which was initially the segment 120 and a new seed component containing a single crystal seed, and the fine grain portions susceptible to grain growth separated by a boundary 113'. The resultant single crystal article will be usable for the production of high strength articles having particular utility in gas turbine engines as described, for example, in U.S. Pat. No. 3,872,563. The other component 126 can be used to repeat the process. As shown in phantom in FIG. 2, the articles 110 and 120 have been blended or beveled near the bond joint. This assists in reducing nucleation of new grains when the joint passes through the thermal gradient.

The process illustrated in FIGS. 1A, 1B, 1C and 1D and described with respect to FIG. 2 is a repetitive process in which an initial seed portion can be used to produce single crystal articles and a new seed portion which can then be used to continue the process. The question reasonably arises as to how the initial seed portion is prepared. The answer to this question is shown in FIGS. 3A, 3B and 3C. In FIG. 3A, there is shown a sheet of material 210 which is mostly comprised of fine grain material 214 which is receptive to grain growth. At one end of the article 210, there has been prepared a plurality of teeth. When the article is passed through a thermal gradient so that the teeth enter the gradient first, it will be found that single crystals nucleate at or near the tips of each tooth and grow down the article as the article progresses through the thermal gradient. The nucleation of the single crystals and their orientation is somewhat random, and although through proper preparation of the material 114 a substantial amount of control can be exerted over the orientation, nonetheless it will usually be found necessary to develop a plurality of single crystals and then to measure their orientation using x-ray techniques and select the one which is closest to the desired orientation. Having selected this crystal, the remaining non-desired teeth are cut off and the part is placed back in the furnace and the selected single crystal is caused to progress up the article as shown in FIG. 3B. In FIG. 3B, the article 210 consists of a non-single crystal portion 214 comprised of fine grain material, a single crystal portion 212 separated from the fine grain portion 214 by a boundary 213. As the part moves through the thermal gradient the boundary separating the single crystal and fine grain portions will move successively through the positions shown as 213', 213'', etc. An analogous procedure is described in the book *The Art and Science of Growing Crystals*, J. J. Gilman, ed. John Wiley and Sons, 1963, pg. 454. The final product, shown in FIG. 3C, is then suited for the process previously described and illustrated with respect to FIG. 2.

Figure 5:
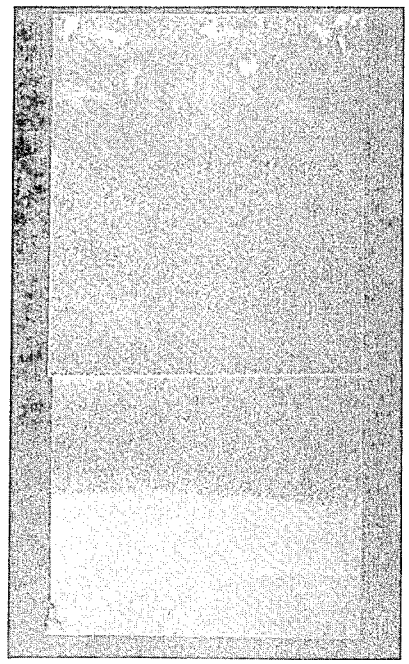
FIG. 5 is a photomacrograph illustrating the growth of a single crystal through a bond.

FIG. 4 is a photomicrograph which illustrates the desirable features of a satisfactory diffusion bond. The most important feature apparent in FIG. 4 is that the bond joint cannot be optically resolved. This characteristic of an optically non-resolvable bond joint (at about 100×) appears to be a sufficient condition for the reliable propagation of a single crystal through a diffusion bond. FIG. 5 is a photomacrograph at a magnification of about 4× which shows the structure after the propagation of the single crystal through a lap joint between two sections of strip material. In FIG. 5, the upper portion of the material was the seed article and contained a single crystal portion and a fine grain portion separated by a boundary. After this upper portion was bonded to the lower portion, comprised entirely of a fine grain material, thermal processing conditions were employed such that the boundary was caused to propagate through the lap joint and into the lower portion. FIG. 5 also illustrates the use of a blended leading edge to minimize the likelihood of initiation of new grains as the leading edge passes through the thermal gradient.

Figure 6:
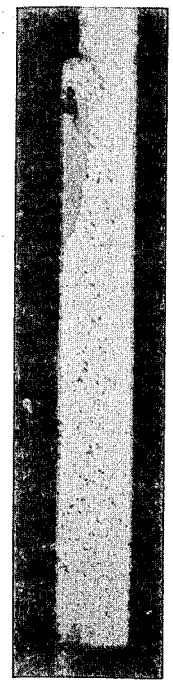
FIG. 6 is a photomacrograph illustrating the nucleation and elimination of extraneous grains.

FIG. 6 is a similar photomacrograph showing a lap joint from which a blended leading edge was not employed, and it can be seen that a secondary or spurious grain was nucleated at or near the abrupt step in the leading edge and this secondary grain propagated for some distance, but was, finally choked off by the grain having the desired seed orientation. Thus, blending the leading edge is preferred.

The invention may be better understood through reference to the following Example which is intended to be illustrative rather than limited.

EXAMPLE

A. Material Preparation
1. Composition (wt. %)—14.4 Mo, 6.25 W, 6–8 Al, 0.04 C, balance Ni
2. Powder size—−80 mesh (U.S. Std. Sieve)
3. Consolidation Method—Hot Isostatic Pressing (H.I.P.) at 2250° F. (1232° C.) and 15 ksi pressure for two hours.
4. Hot Working—by rolling at 2200° F. (1204° C.) to 60% reduction.
5. Cold Rolling—total reduction 65%
   a. cold straight rolled
   b. cold cross rolled ratio of cold straight rolling to cold cross rolling=75:25, intermediate anneals at 2200° F. (1204° C.).
6. Resultant Texture—singular {110}<112>, 7× random.

B. Seed Preparation—as described with respect to FIGS. 3A, 3B and 3C orientation {100}<110> with regard to longitudinal axis.

C. Bonding
1. Faying surfaces prepared to flatness within 0.0002 in. in 6 in. (0.0005 cm in 15.24 cm) surface roughness ≦ 15µ in surface preparation by double disk grinding;
2. Faying surfaces cleaned by electropolishing in a solution of 7% perchloric acid in acetic acid at room temperature at 25 v for 60 sec. to remove approximately 0.0001 inch (0.0003 cm) metal from each surface;
3. Bonding performed at 2050° F. (1121° C.) (alloy gamma prime solvus temperature is 2315° F., 1268° C.) using delta-alpha (molybdenum) tooling to produce about 2% deformation in 3 hours at temp.

D. Directional Recrystallization
1. Thermal gradient of 180° F./in. (82° C./cm) (measured at gamma prime solvus temp.) employed
2. Motion of bonded assembly through thermal gradient was parallel to cold straight rolling direction at 0.125 in.–2 in. (0.318 cm–5.08 cm) per hour. Result was propagation of {100}<110> single crystal through bond.
3. D. R. terminated leaving single crystal-bond-fine grained portion suitable for reuse.

Although this invention has been shown and described with respect to detailed embodiments thereof, it will be understood by those skilled in the art that various changes in form and detail thereof may be made without departing from the spirit and scope of the claimed invention.

We claim:
1. A method for producing single crystal material of controlled crystallographic orientation including the steps of:
   a. providing a first article which is comprised of a single crystal portion and a polycrystalline portion receptive to grain growth, said two portions being separated by a boundary which is capable of movement into the polycrystalline portion under proper conditions;
   b. providing a second article comprised of polycrystalline material which is receptive to grain growth;
   c. bonding the first and second articles together to form a third article so that the polycrystalline portion of the first article is bonded to the second article; said bonding being performed by a process which does not adversely affect the receptivity of the polycrystalline material to grain growth, which produces a joint which does not impede the passage of the single crystal boundary and which does not cause nucleation of new grains at the bond interface;

d. treating the bonded article in a thermal gradient so as to cause the single crystal portion to grow through the bond and into the second article material.

2. A method as in claim 1 which includes the step of stopping the single crystal growth in step d at a point where polycrystalline material remains and severing the single crystal-boundary polycrystalline portion of the third article so as to provide a starting article to repeat the process.

3. A method as in claim 1 in which the polycrystalline material in both the first and second articles has a predetermined texture which makes it particularly adapted to the growth of single crystals of substantially the orientation of the single crystal portion.

4. A method as in claim 1 in which the first and second articles are nickel base superalloys bonded together by diffusion bonding performed at a temperature which is 150° F.–400° F. (66° C.–204° C.) below the gamma prime solvus temperature of the alloys.

5. A method as in claim 1 in which the first and second articles are in sheet form and are bonded together with a lap joint.

6. A method as in claim 5 in which the leading edge, that edge which is nearest the single crystal portion of the first article has been beveled so as to blend the joint.

* * * * *